United States Patent [19]

Fukushima et al.

[11] Patent Number: 5,037,316
[45] Date of Patent: Aug. 6, 1991

[54] BOARD-SURFACE MOUNTING TYPE ELECTRIC CONNECTOR

[75] Inventors: Minoru Fukushima, Yokohama; Shinsuke Kunishi, Osaka; Kazushinge Asakawa, Asahi, all of Japan.

[73] Assignee: Molex Incorporated, Lisle, Ill.

[21] Appl. No.: 553,020

[22] Filed: Jul. 16, 1990

[30] Foreign Application Priority Data

Jul. 19, 1989 [JP] Japan ............... 1-84812[U]

[51] Int. Cl.⁵ .................................. H01R 9/09
[52] U.S. Cl. .......................... 439/83; 439/79
[58] Field of Search .......... 439/78, 79, 80, 82, 439/83, 85, 444, 869, 874, 876; 29/840, 843; 228/180.2

[56] References Cited

U.S. PATENT DOCUMENTS

| | | | |
|---|---|---|---|
| 4,634,198 | 1/1987 | Rush | 439/79 X |
| 4,676,565 | 6/1987 | Reichardt | 439/79 |
| 4,688,875 | 8/1987 | O'Connor | 439/79 X |

FOREIGN PATENT DOCUMENTS 3710394 10/1988 Fed. Rep. of Germany ...... 439/876

Primary Examiner—Neil Abrams
Assistant Examiner—Khiem Nguyen
Attorney, Agent, or Firm—Louis A. Hecht; Stephen Z. Weiss; Charles S. Cohen

[57] ABSTRACT

Disclosed is an improved board-surface mounting type electric connector whose pin terminals are designed to be soldered to a printed circuit pattern by their tail sections. Each tail section is composed of a soldering portion, an intermediate stepwise joint and a non-soldering portion. The soldering portion of the tail section is laid on the printed board, and the non-soldering portion is laid on an isolation wall at a level higher than the printed board, thus leaving space between the printed board and the non-soldering portion available for printing desired circuit patterns. Connector housing may have at least one stopper to abut on the upper surface of each soldering portion for preventing it from rising, thereby keeping each soldering portion stable in position.

4 Claims, 4 Drawing Sheets

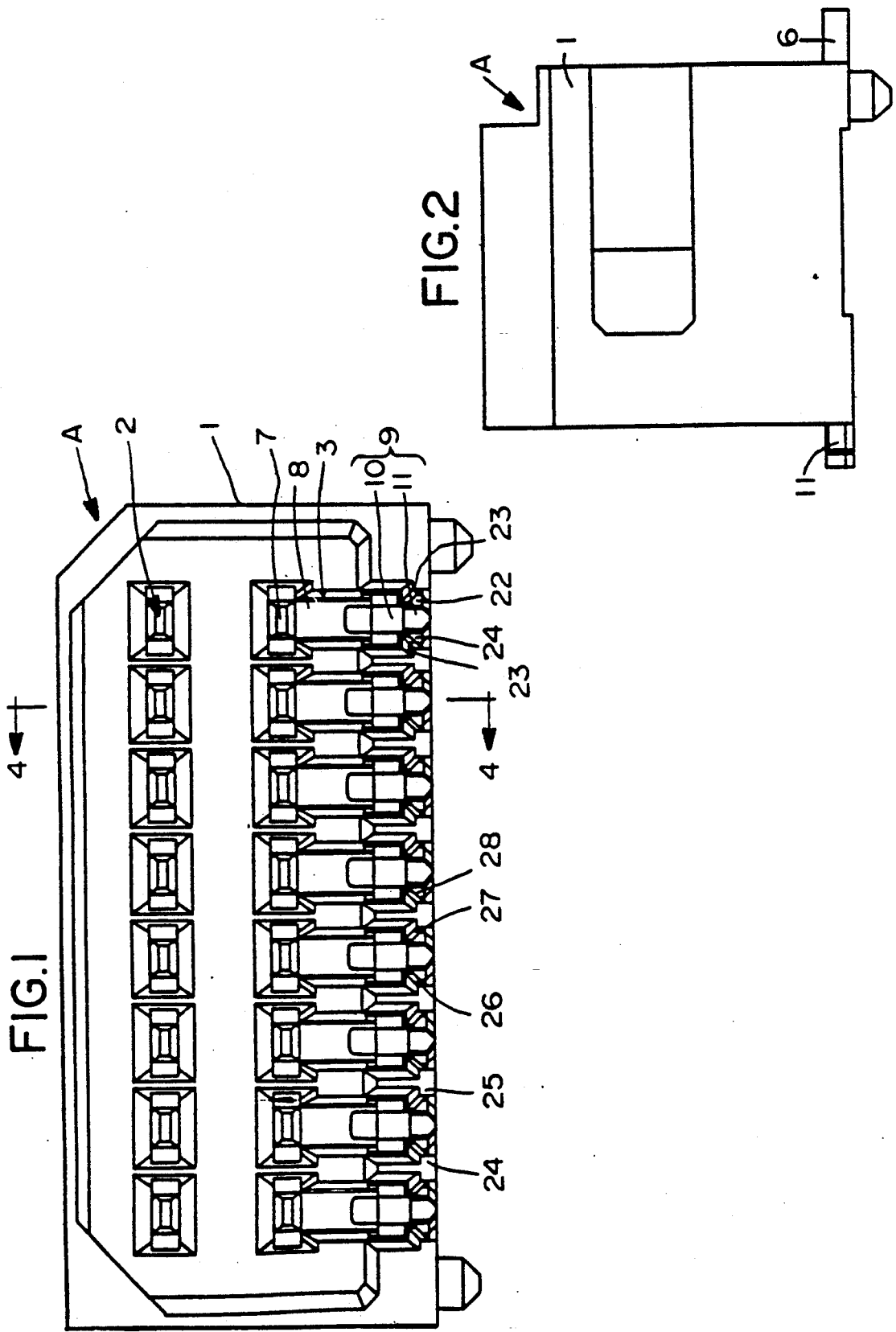

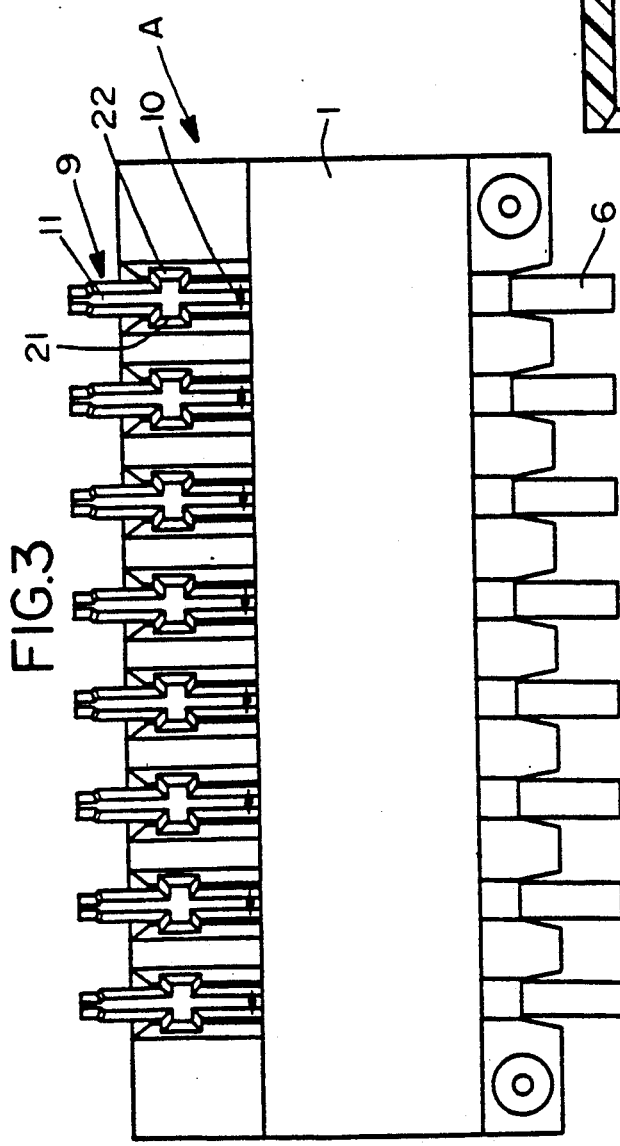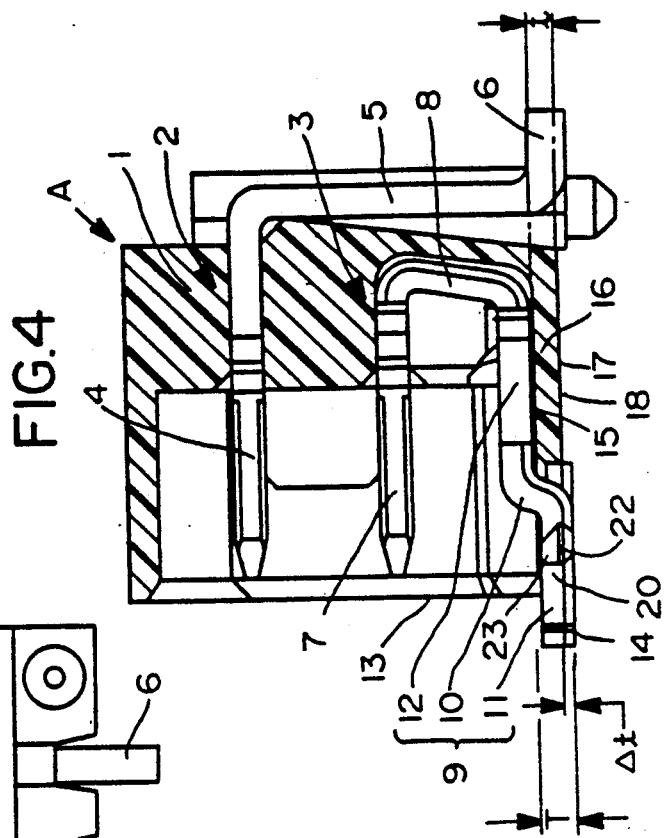

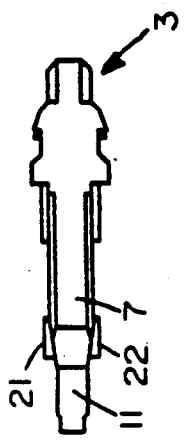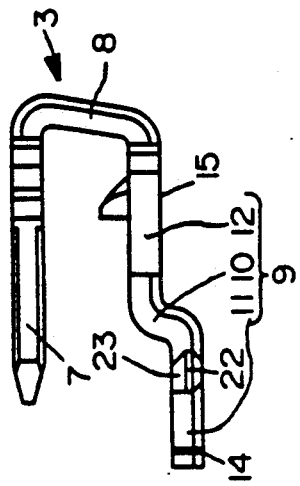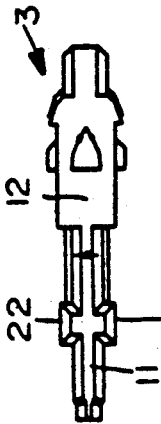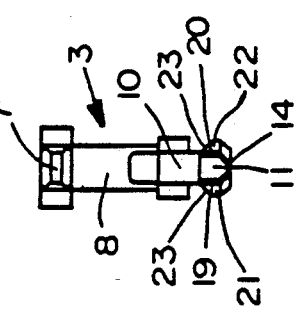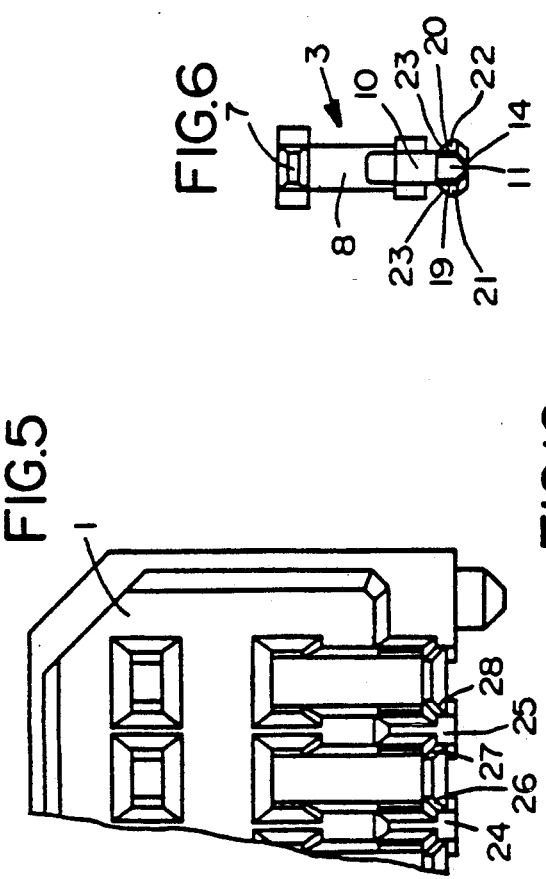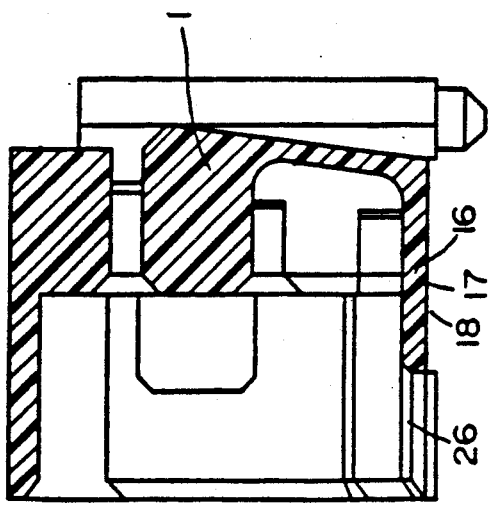

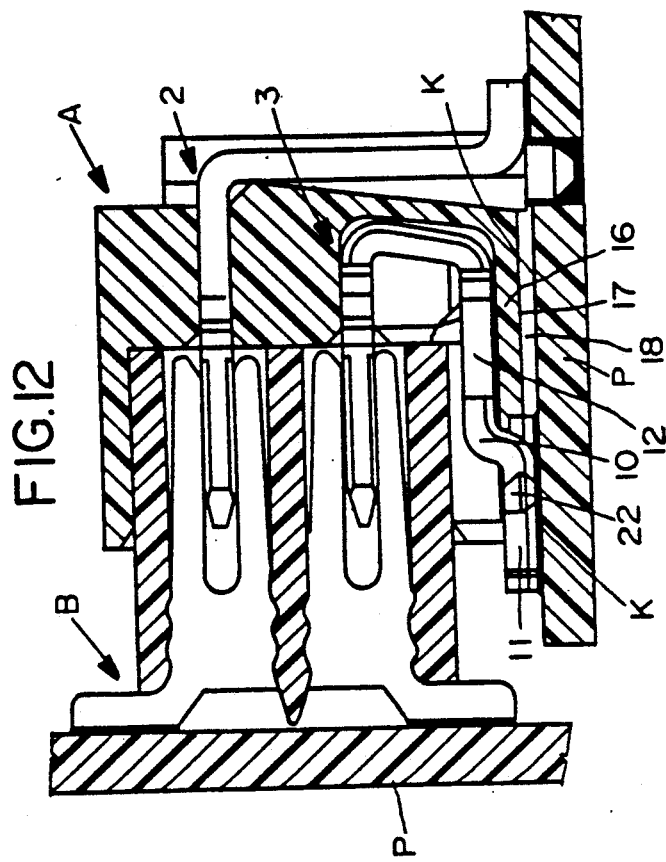
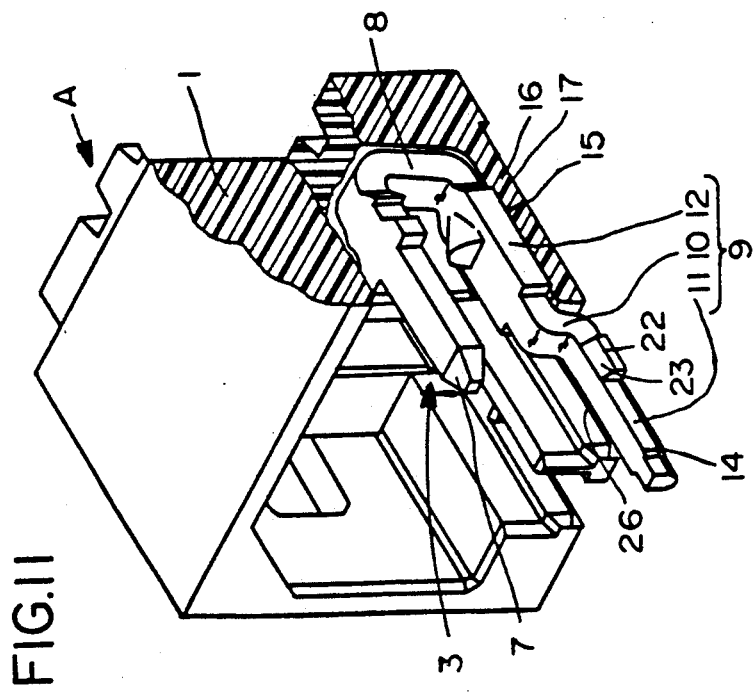

BOARD-SURFACE MOUNTING TYPE ELECTRIC CONNECTOR

BACKGROUND OF THE INVENTION

1. Field of the Invention

The present invention relates to an electric connector, and more particularly to a board-surface mounting type electric connector which is suitable for making an electrical connection between two printed circuits.

2. Description of the Prior Art

As is well known, there are a variety of electrical connectors of the type which are adapted to be mounted to printed boards. One type of electric connector has a plurality of terminals fixed to its housing. In use, the housing is fixed to a printed board by using fixing means, and the terminals are soldered to the circuit pattern at their soldering tails.

There are two kinds of board-surface mounting type electric connectors. One board-surface mounting type electric connector uses terminals whose tails are to be soldered to the circuit pattern over their full length. The other board-surface mounting type electric connector uses terminals each having a stepwise-bent tail composed of a soldering portion and a non-soldering portion. The non-soldering portion extends at a level which is higher than the soldering portion. Thus, when the soldering portion of each terminal tail is soldered to the printed circuit, the non-soldering portion extends just above the printed board, leaving a small space therebetween.

These conventional electric connectors are almost satisfactory. However, they still have some defects. With the electric connector in which the full length of each tail is soldered to a printed circuit, the soldering area is large. The relatively large soldering area assures that terminals can be soldered firmly to a printed circuit. However, this large soldering area reduces the area on which electric circuits can be printed. With the other prior art electric connector whose terminals have stepwise-bent tails each composed of lower soldering and upper non-soldering portions, the soldering area is smaller, increasing the area on the printed board on which electrical circuits can be printed. However, the relatively small soldering area available tends to create unreliable soldering of terminals. Also because it is necessary that the non-soldering portion of the terminal tail extend at such a raised level so that it will not contact the surface of the underlying printed board, the height of electric connector must be increased.

Neither the former nor later type conventional electric connector has anti-floating means to prevent the soldering tail of each terminal from rising or sinking with respect to a given reference level. Since the soldering tail is made of a narrow piece of metal, it can easily change its shape and rise or sink with respect to a given reference level. This floating tendency causes inconvenience in soldering terminal tails on printed boards.

SUMMARY OF THE INVENTION

One object of the present invention is to eliminate the above problems by providing an electrical connector to be mounted to a printed board in which the electric connector has 1) an isolation wall extending between the non-soldering portion of the stepwise-bent tail section of each terminal and underlying printed board, thereby permitting use of the part of the printed board under the non-soldering portion without fear of undesired contact and short circuit between the non-soldering portion and the printed circuit; 2) anti-floating means to prevent floating of the soldering tail of each terminal, thereby facilitating soldering work; and 3) reduced height as compared with an electrical connector having no isolation wall between the non-soldering portion of each terminal tail and a printed board.

To attain the object of the present invention, a board surface mounting type electric connector having pin terminals fixed to its housing, the tail section of each terminal being adapted to be soldered to the circuit pattern of a printed board, is improved according to the present invention in that: each tail section is composed of a soldering portion, a non-soldering portion and an intermediate joint integrally connected to the soldering and non-soldering portions at opposite ends. The soldering portion is adapted to be soldered to the circuit pattern, and the non-soldering portion is located above the plane on which the circuit pattern is laid. The housing has at least one stopper projection abutting the upper surface of the soldering portion preventing the soldering portion from rising. The isolation wall is provided to said housing to isolate the non-soldering portion from the circuit pattern, where the isolation wall extends above the printed board, leaving a relatively narrow space therebetween.

With this arrangement the isolation wall of the connector housing separates the non-soldering portion of each terminal tail section from underlying printed circuits, thereby eliminating the possibility of a short circuit therebetween. The isolation wall extends above the underlying printed circuit, leaving only a small gap therebetween to permit use of the underlying area on the printed board. This gap plus isolation thickness is smaller than the space which is large enough to assure no contact between non-soldering portion and underlying printed circuits. Therefore, the entire height of electric connector is less than conventional electric connectors in which non-soldering portion of each terminal tail section is spaced from underlying printed circuit without intervening objects. Also, the undesired rise of the soldering tail of each terminal is prevented by stoppers which are provided to the connector housing, thereby facilitating soldering work.

Other objects and advantages of the present invention will be understood from the following description of a board-surface mounting type electric connector to a preferred embodiment of the present invention, which is shown in the accompanying drawings.

BRIEF DESCRIPTION OF THE DRAWINGS

FIG. 1 is a front view of an electric connector according to one embodiment of the present invention.

FIG. 2 is a right side view of the electric connector.

FIG. 3 is a bottom view of the electric connector.

FIG. 4 is a section view of the housing taken along the line 4—4 in FIG. 1.

FIG. 5 is a front view of a fragment of the housing alone.

FIG. 6 is a front view of a pin terminal.

FIG. 7 is a right side view of the pin terminal.

FIG. 8 is a top view of the pin terminal.

FIG. 9 is a bottom view of the pin terminal.

FIG. 10 is a sectional view of the housing without the pin terminal taken along the line 4—4 in FIG. 1.

FIG. 11 is a perspective view of the fragment of the housing with a terminal fitted therein in its lower line.

FIG. 12 is a section view of the connector, showing how it can be used.

DETAILED DESCRIPTION OF THE PREFERRED EMBODIMENT

As shown in FIGS. 1, 2 and 3, the electric connector has a plurality of pin terminals 2 and 3 arranged at a regular pitch in its housing 1. Terminals arranged in the upper line are indicated at 2 whereas terminals arranged in the lower line are indicated at 3. Each upper terminal pin is composed of contact section 4, intermediate section 5 bent perpendicular to contact section 4, and tail section 6 bent perpendicular to intermediate section 5 and extending behind housing 1. Each lower terminal pin 3 is composed of contact section 7, intermediate section 8 bent perpendicular to contact section 7, and tail section 9 bent perpendicular to intermediate section 5 and extending forward.

As best seen from FIG. 4, the tail section 9 of the pin terminal 3 is composed of soldering portion 11 which is to be soldered to circuit pattern K in printed board P, stepwise joint portion 10 integrally connected to soldering portion 11 at one of the opposite ends of the joint portion; and non-soldering portion 12 integrally connected to the other end of stepwise joint portion 10. More specifically, soldering portion 11 extends forward until its free end appears from he front opening 13 of housing 1. The consecutive stepwise joint portion 10 rises only a small amount and levels off to the consecutive non-soldering portion 12, which is integrally connected to intermediate section 8 of pin terminal 3. As a result the bottom surface 15 of non-soldering portion 12 is one stair T above the bottom surface 14 of soldering portion 11.

Horizontal isolation wall 16 is fixed to the bottom of housing 1, thereby isolating non-soldering portion 12 of tail section 9 from underlying printed board P, particularly circuit pattern K thereon. Non-soldering portion 12 is laid on and supported by isolation wall 16. The thickness t of isolation wall 16 is smaller than T ( t<T ), thus leaving small gap Δt (=T−t) below the lower surface 17 of isolation wall 16, as indicated at 18. The reference plane for soldering extends below the undersurface 14 of soldering portion 11. There appears a gap 18 above this reference plane. Anti-floating stoppers 26, 27 are integrally connected to housing 1 above soldering portion 11. As seen from FIGS. 6 to 9, blade projections 21 and 22 are integrally connected to the opposite sides 19 and 20 of the soldering portion 11.

Each blade projection has a chamfer 23 on its top. As seen from FIGS. 5 and 10, stoppers 26 and 27 project from opposite sides 24 and 25 which define the space to accommodate tail section 9 of pin terminal 3. The lower surfaces 28 of stoppers 26 and 27 hang over the chamfers 23 of opposite blades 21 and 22. In this particular embodiment opposite blade projections 21 and 22 of soldering portion 11 of the tail section of pin terminal 3 will be caught by stoppers 26 and 27 to prevent the rising of soldering portion 11. For this purpose it suffices that only one stopper is provided to housing 1 to catch either blade projection 21 or 22 of soldering portion 11. Also, it suffices that only one stopper is provided to housing 1 at such a position that soldering portion 11 having no blade projections abuts on the stopper when it rises. The stopper may be resiliently biased towards circuit pattern K, thereby applying a force to push soldering portion 11 towards circuit pattern K.

FIG. 12 shows an electrical connector A, according to this particular embodiment, as being attached to a printed board P. As shown, the electrical connector A is coupled to another electrical connector B, which is attached to another printed board B, thereby making electrical connection between these printed boards P and P'.

As seen in FIG. 12, particularly the part of the drawing which shows the tail section of terminal 3 in electrical connector A, non-soldering portion 12 is isolated from underlying printed circuit pattern K by isolation wall 16, thereby assuring that no short circuit is caused between circuit pattern K and non-soldering portion 12. A narrow gap 18 remains between the undersurface of isolation wall 16 and the surface of printed board P, thus permitting the space of printed board P under isolation wall 16 to bear printed circuit portion K.

As described earlier, use of the isolation wall 16 permits reduction of the gap to the lowest possible level, and accordingly the entire height of the electrical connector A can be reduced. Tail section 9 is divided into non-soldering and soldering portions, and therefore, the soldering portion is short in length. This short soldering portion, however, will be prevented from rising by overhanging stoppers 26 and 27, thereby keeping the undersurface 14 of the soldering portion 11 horizontal at all times. This facilitates soldering work, and reliable soldering may be assured.

As may be understood from the above, the space of a printed board under non-soldering portion of each terminal may be used in printing desired circuit patterns, and accordingly dead space of the printed board can be reduced. The circuit pattern which is printed on the space of the printed board under the non-soldering portion of each terminal tail section, cannot contact the overlying non-soldering portion because of the intervening isolation wall. The soldering portion of each terminal tail section is prevented from rising by overhanging stoppers, thereby putting it in such a stable condition that soldering may be performed with ease. Also, advantageously, the entire height of the electric connector can be appreciably reduced.

The present invention may be subject to many modifications and changes without departing from the spirit or essential characteristics thereof. The present embodiment should therefore be considered in all respects as illustrations and not restrictive of the scope of the invention.

What is claimed is:

1. A board-surface mounting type electric connector in which the tails (9) of the pin terminals (3) of the connector housing (1) are to be soldered to the circuit pattern K of a printed board P, characterized in that each of said tails (9) is composed of a planar soldering portion (11), non-soldering portion (12) and intermediate stepwise joint (10) integrally connected to said soldering portion (11) and said non-soldering portion (12) at its opposite ends, said soldering portion (11) being adapted to be soldered to said circuit pattern K of said printed board P, and said non-soldering portion (12) being above the plane on which said circuit pattern K is laid; said connector housing (1) having at least one stopper projection to abut the upper surface of said soldering portion (11) for preventing said soldering portion (11) from rising; and isolation wall (16) adjacent said non-soldering portion (12) to isolate said non-soldering portion (12) from said circuit pattern K of said printed board P, said isolation wall (16) extending above said printed board P, leaving a relatively narrow space therebetween.

2. A board-surface mounting type electric connector according to claim 1 wherein said stopper projections are integrally connected to said connector housing (1), hanging over opposite sides of said soldering portion (11).

3. A board-surface mounting type electric connector according to claim 1 wherein said stopper projections are integrally connected to said housing (1), hanging over one side of said soldering portion (11).

4. A board-surface mounting type electric connector according to claim 1 wherein said soldering portion (11) has at least one blade projection integrally connected to one side thereof contacting at least one stopper projection.

* * * * *

UNITED STATES PATENT AND TRADEMARK OFFICE
CERTIFICATE OF CORRECTION

PATENT NO. : 5,037,316
DATED : August 6, 1991
INVENTOR(S) : Fukushima et al.

It is certified that error appears in the above—identified patent and that said Letters Patent is hereby corrected as shown below:

On title page, item [19] and [75]
The inventors should be:

Kazushige Asakawa
    Minoru Fukushima
    Shinsuke Kunishi

Signed and Sealed this

Thirtieth Day of March, 1993

*Attest:*

STEPHEN G. KUNIN

*Attesting Officer*     *Acting Commissioner of Patents and Trademarks*